(12) United States Patent
Tackett et al.

(10) Patent No.: US 6,329,830 B1
(45) Date of Patent: *Dec. 11, 2001

(54) SCREEN DISPLAY FOR AUTOMATED VERIFICATION AND REPAIR STATION

(75) Inventors: Doug Tackett, Henniker, NH (US); Mark A. Swart, Anaheim Hills, CA (US)

(73) Assignee: Delaware Capital Formation, Inc., Wilmington, DE (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/300,033

(22) Filed: Apr. 27, 1999

Related U.S. Application Data

(60) Provisional application No. 60/083,372, filed on Apr. 28, 1998.

(51) Int. Cl.[7] ................................................. G01R 31/02
(52) U.S. Cl. ............................................. 324/761; 348/126
(58) Field of Search ..................................... 324/761, 754, 324/757, 758, 158.1, 765, 763; 348/87, 92, 126; 345/1.3; 714/738; 716/11

(56) References Cited

U.S. PATENT DOCUMENTS 5,999,268 * 12/1999 Yonezawa et al. .................. 324/754
6,002,426 * 12/1999 Back et al. ........................... 324/758

* cited by examiner

*Primary Examiner*—Safet Metjahic
*Assistant Examiner*—J Kerveros
(74) *Attorney, Agent, or Firm*—Christie, Parker & Hale, LLP

(57) ABSTRACT

A flying prober having at least one prober head for contacting test sites on a unit under test which is programed for measuring isolations and continuities of test sites through the prober head. The prober heads include a camera and a test probe wherein the camera views and verifies contact between the test probe and the test sites. A display screen illustrates at least a real time camera view of the unit under test and a computer generated detail view of the unit under test for comparison.

15 Claims, 4 Drawing Sheets

SCREEN DISPLAY FOR AUTOMATED VERIFICATION AND REPAIR STATION

CROSS REFERENCE TO RELATED APPLICATIONS

This application claims priority from U.S. Provisional Application No. 60/083,372 filed Apr. 28, 1998.

FIELD OF THE INVENTION

This invention relates to screen displays for the automatic testing of bare printed circuit boards, and more particularly, to a screen display for a fault verification and repair station.

BACKGROUND OF THE INVENTION

Traditional manual bare circuit board fault verification has been a tedious process. Most of the associated equipment merely provided a visual aid in the fault verification process. Typically a flying prober would be utilized for this purpose which traditionally was used to test prototype circuit boards providing the benefit that a test fixture did not have to be devised for the prototype circuit board. Using a flying prober provided the benefit of making it easier to test fine pitch test sites on the circuit boards. A problem with flying probers is that they are slow in testing the circuit board due to the requirement for manually contacting each required test site on the circuit board, which in contrast to a fixture which can test all the test sites on the circuit board simultaneously.

Traditional repair stations have also been used for fault verification for bare circuit boards. Traditional repair stations are graphics based having software which illustrates the circuitry to indicate where the possible failure could be. The repair station utilizes the failure data from the tester and verifies the failure data by hand placement of probes. Software used in connection with traditional repair stations provides risk areas for areas such as shorts or opens based upon the physical layout of the circuitry and the likelihood of conductors in close proximity to each other. Plasma displays including a glass hood where the circuit is projected and the error is highlighted also have been used in repair stations. This method is unacceptable due to the ever shrinking size of today's circuit boards and the associated closeness of test locations. Conventional repair stations simply helped an operator locate a failed net end point designated by the tester, but stopped short of helping verify the fault and tracking down the location of the actual defect.

Flying probers have also been used in the repair process to verify error data from a tester. Typically there are two kinds of flying probers, namely, vertical probers and horizontal probers. In a vertical flying prober, the circuit board to be tested stands vertically upright and a probe contacts the board from either side depending upon the test site locations. The board is manually loaded and held in an upright position by hand manipulated clamps which are moved to the appropriate position and tightened to secure the circuit board. A disadvantage with vertical flying probers is that it is time consuming to manually move each clamp into position and manually manipulate the clamp to secure the circuit board. In the horizontal flying prober, the circuit boards are manually loaded into a drawer which is pulled out from the frame structure of the prober. Clamps hold the board to secure the circuit boards in a horizontal position. Again, the disadvantage in a horizontal flying prober is the time consuming and labor intensive procedure of manually loading boards in the drawer for testing.

Previous repair stations could not provide the user the ability to simultaneously view the board being tested in full along with particular potential failure areas highlighted against a standard to easily and quickly locate, identify and verify the error data. Consequently, a need exists for a flying prober verification and repair station with a screen display with an improved ability to track down the location of an actual defect and verify the fault.

SUMMARY OF THE INVENTION

The present invention is a novel screen display for an automated bare board fault verification and repair station having a locating and loading mechanism which atomically secures the circuit board to be tested or unit under test (UUT) in position. The fault verification and repair station of the present invention will also be referred to as a flying prober. The flying prober of the present invention includes, preferably, two pairs of X-Y-Z prober heads positioned one pair on each side of the unit under test which move independently across the surface of the circuit board to contact the desired test locations on the circuit board. Although two prober heads are preferred, more or less can be used, and on one or both sides of the UUT. The flying prober further includes electronic hardware and software for measuring isolations and continuities of the test sites electrically connected to the prober heads. The prober further includes a loading and locating mechanism for automatically securing the unit under test on the prober relative to the prober heads.

The loading and locating mechanism includes an upper housing and a lower housing one each positionable at opposite ends of the circuit boards. The housings include a lower lip for resting the edges of the circuit board on the housing. The lower housing is fixed on the frame of the flying prober and the upper housing is adjustable by screw clamps to accommodate different sized circuit boards. Positioned inside each of the upper housing and the lower housing is a movable clamping block having a plurality of finger springs rotatable by a dowel rod to lift and lower the springs above the upper surface of the circuit board. An air cylinder on either end of the clamping blocks moves the clamping block forward and backward. Similarly, an air cylinder, or other suitable actuator rotates the dowel rod to raise and lower the finger springs.

A camera is located on the prober head to view both the test probe in the prober head and the test site to verify the test probe is making contact with the test site. The camera image is generated on a computer screen for viewing by the operator of the verification and repair station.

In operation, the upper housing is manually set to the desired positioned according to the specific size of the circuit board to be tested by securing the screw clamps to the frame. The circuit board to be tested is then positioned on the housing such that the edges of the circuit board rest on the lip of the upper and lower housing. Because the frame is angled, gravity allows the circuit board to be located on the clamping mechanism. With the finger springs in a raised position, the clamping blocks are actuated forward towards the circuit board to position the ends of the finger springs over the edge of the circuit board. The dowel rod is then actuated to lower the finger springs into contact with the upper surface of the circuit board along the edge to securely clamp the circuit board in the flying prober. The prober heads are then actuated across the surface of the circuit board to conduct the fault verification process. The dowel rod, clamping block and prober heads are automatically operated and controlled by the software programed within the flying prober. The test probe contacts the test sites and the camera projects the image to verify contact between the test probe and the test sites.

The verification and repair station initially reads a data file corresponding to the circuit board to be tested. The station then reads in the error file from a grid tester or prober which prints a bar card report. Next, the verification process generates files that include all of the defect locations, identifications and video images. When the optional bar code is scanned at the repair station, the repair operator is led defect by defect through the unit under test. The CAD data is cross-referenced with the failure data location. Software includes the ability to evaluate which risk area has a higher probability of having the error location by strategically choosing test locations to measure resistance levels between the locations and choose risk areas based upon lowest resistance measurement between those test locations. This is accomplished by starting with the risk area with the closest test site locations and choosing test site locations closest to the risk area by measuring the resistance between those test sites. A digital multi-meter is connected to the prober head to measure the resistance levels for the test site locations. The prober heads automatically move to the exact location of the first reported fault to make a precise resistance measurement on the pair of failed nodes. When the end points are verified, the reported fault is identified as either false or real. Once the fault has been verified, the repair station uses a real-time high-resolution video camera to magnify the image of high risk locations.

The screen display is divided into quadrants in which a first quadrant depicts a real-time camera view of the unit under test, in a second quadrant a detailed CAD view mated to the camera view in size, position and orientation is depicted, in a third quadrant an orientation view of the entire unit under test is depicted, and in the fourth quadrant user input/output dialogs and buttons are displayed. The real-time camera view of the unit under test can be panned to depict any location of the unit under test. The real-time camera view can be compared to the detailed CAD view of what the circuit board should comprise to easily identify the error. The repair station also includes the ability to mark the location of the error with an electronic marker for subsequent repair. The software marks and describes the error to generate a report for subsequent repair.

DETAILED DESCRIPTION

Figure 1:
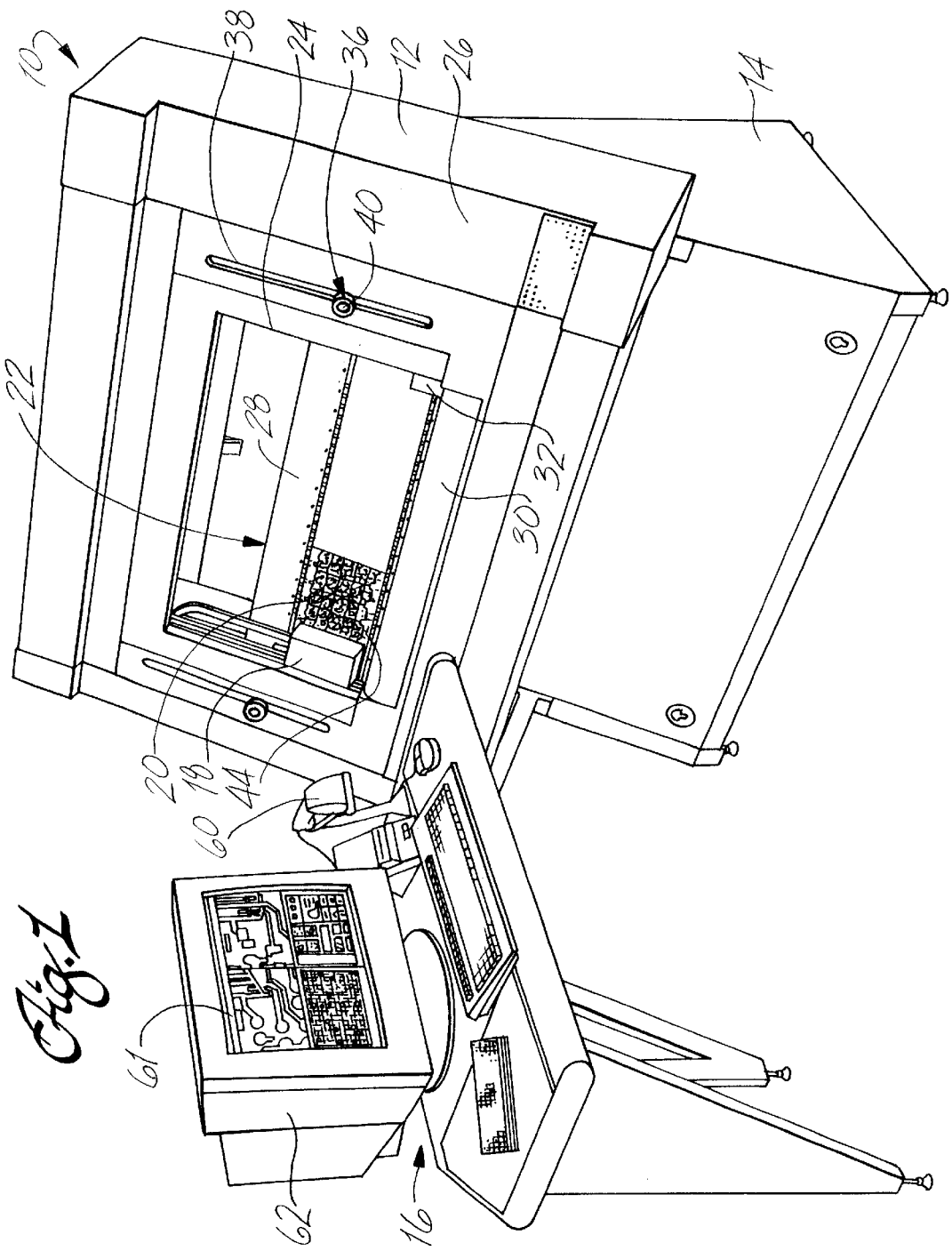
FIG. 1 is a perspective view of the flying prober of the present invention.

FIG. 1 illustrates the automated bare board fault verification and repair station, and hereinafter referred to as a flying prober 10 of the present invention. The flying prober includes an angled frame 12 supported upon a base 14 and an input station 16 positioned adjacent the angled frame 12. The angled frame includes at least one prober head 18, and preferably two prober heads for movement across the surface of a bare printed circuit board or unit under test 20. The prober head includes a camera 21 positioned to view the test probe 23 as it makes contact with a test site on the unit under test. The unit under test is positioned within the angled frame by an automated locating and loading mechanism 22 positioned within an opening 24 in the face 26 of the angled frame 12.

Figure 2:
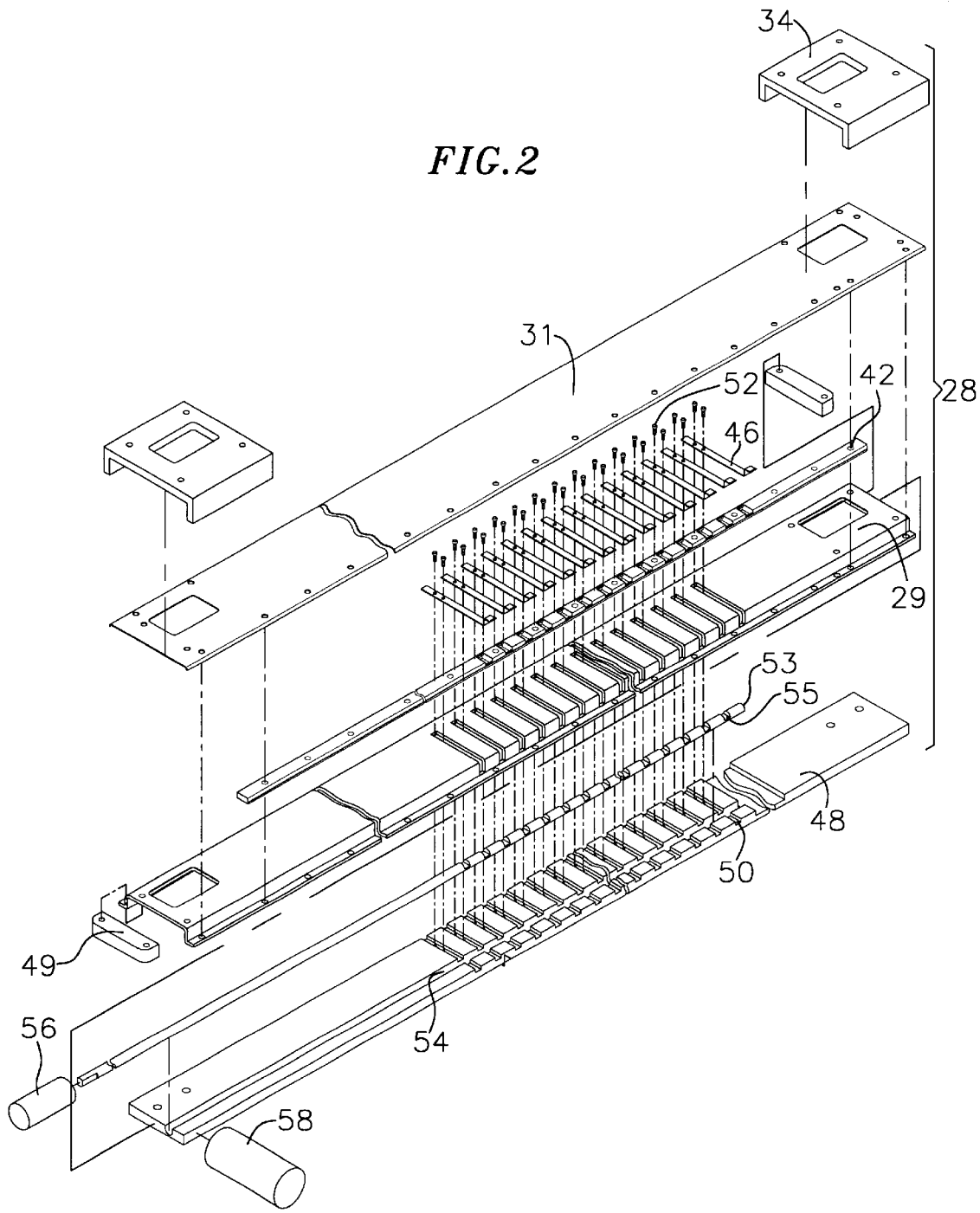
FIG. 2 is an exploded assembly view of the locating and loading mechanism of the flying prober of FIG. 1.

As also seen in FIG. 2, the automated loading and locating mechanism 22 includes an upper housing 28 and a lower housing 30. The upper and lower housings are positioned within the opening in the angled frame at a distance away from each other corresponding to the width of the unit under test 20. Lower housing 30 is rigidly positioned in the angled frame by mounting blocks 32 positioned on either end of the housing. The upper housing 28 includes a body portion 29 and a cover 31 which are moveable to accommodate varying width circuit boards to be tested by having mounting blocks 34 positioned on either end of the upper housing which are connected to a screw clamp 36 adjustable within vertical slots 38 in the face 26 of the angled frame. Screw clamps 36 are adjusted by rotation of knobs 40 to loosen and tighten the screw clamp along the desired location of the vertical slot. Both the upper and lower housing have a lip 42 extending along the surface adjacent to the unit under test. The lips 42 can be integrally formed within the upper or lower housing or can be a separate component fastened to the housing by screws, rivets, etc. The lips form a surface for receipt of the unit under test.

Considering the loading and locating mechanism 22 is positioned within the angled frame, the mechanism is also in an angled position thereby allowing gravity to initially hold the unit under test between the upper and lower housing on the lips. The unit under test is simply placed by hand between the upper and lower housing against a stop 44 located on the left hand side of the housing which is the prober location for registration by the prober heads.

The unit under test is held in position between the upper and lower housing by a plurality of finger springs 46 extending from both the upper and lower housing and are positioned along the length of a clamping block 48 positioned within the upper and lower housing. The clamping block 48 is secured within body portion 29 by blocks 49 located on either end of the body portion. The finger springs are positioned along the length of a clamping block wherein each finger spring is positioned within a groove 50 corresponding to the width of each finger spring. Preferably the finger springs 46 are secure to the clamping block by screws 52. The finger springs extend beyond the edge of the clamping blocks. The fingers springs are raised and lowered by a dowel rod 53 positioned within a groove 54 extending along the length of the clamping block. The dowel rod has a plurality of notches 55 corresponding to the width of the finger springs. The finger springs are lowered to their unit under test engaging position by rotating the dowel rod so that the notches in the dowel rod are adjacent the finger springs. The finger springs are raised by rotating the dowel rod thereby moving the notches in the dowel rod away from the finger springs so that the non-notched portion of the dowel rod lifts the finger springs upperwardly and away from the unit under test. The dowel rod is rotated by a liner actuator 56, such as an air cylinder.

The clamping block is moved toward and away from the unit under test also by a liner actuator 58, such as an air cylinder. The liner actuators for the dowel rod and the clamping block are attached to the upper and lower housing.

When the unit under test is loaded into the upper and lower housing the clamping block is in its retracted position and the finger springs are in their raised position. The clamping blocks are then moved forward positioning the bent end of the finger springs over the edge of the unit under test. The dowel rod is then actuated to lower the bent ends of the finger springs on to the upper surface of unit under test thereby securely clamping the unit under test on the lips of the upper and lower housing.

The fault verification is then performed by moving the prober heads over the surface of the unit under test to make contact with the desired test locates on the unit under test.

As seen in FIG. 1, first an operator scans a bar code on an error tag generated from a tester for a particular unit under test. A bar code scanner 60 is located on the input station 16. The fault file 61 is instantly imported to the computer screen 62. Next, the unit under test is loaded into the locating and loading mechanism 22. The unit under test is slipped into the preset position which eliminates the need for board specific tooling hardware. The prober heads automatically move to the exact location of the first reported fault and make a precise resistance measurement on the pair of failed nodes. When the end points are verified, the reported fault is identified as either false or real. Once the fault has been verified the real-time high-resolution video camera 21 magnifies the image of high risk locations. The actual area of the circuit board is viewable on the computer screen for a visual inspection as to whether a defect exists and to verify that the test probe 23 is making proper contact with the test location.

Figure 3:
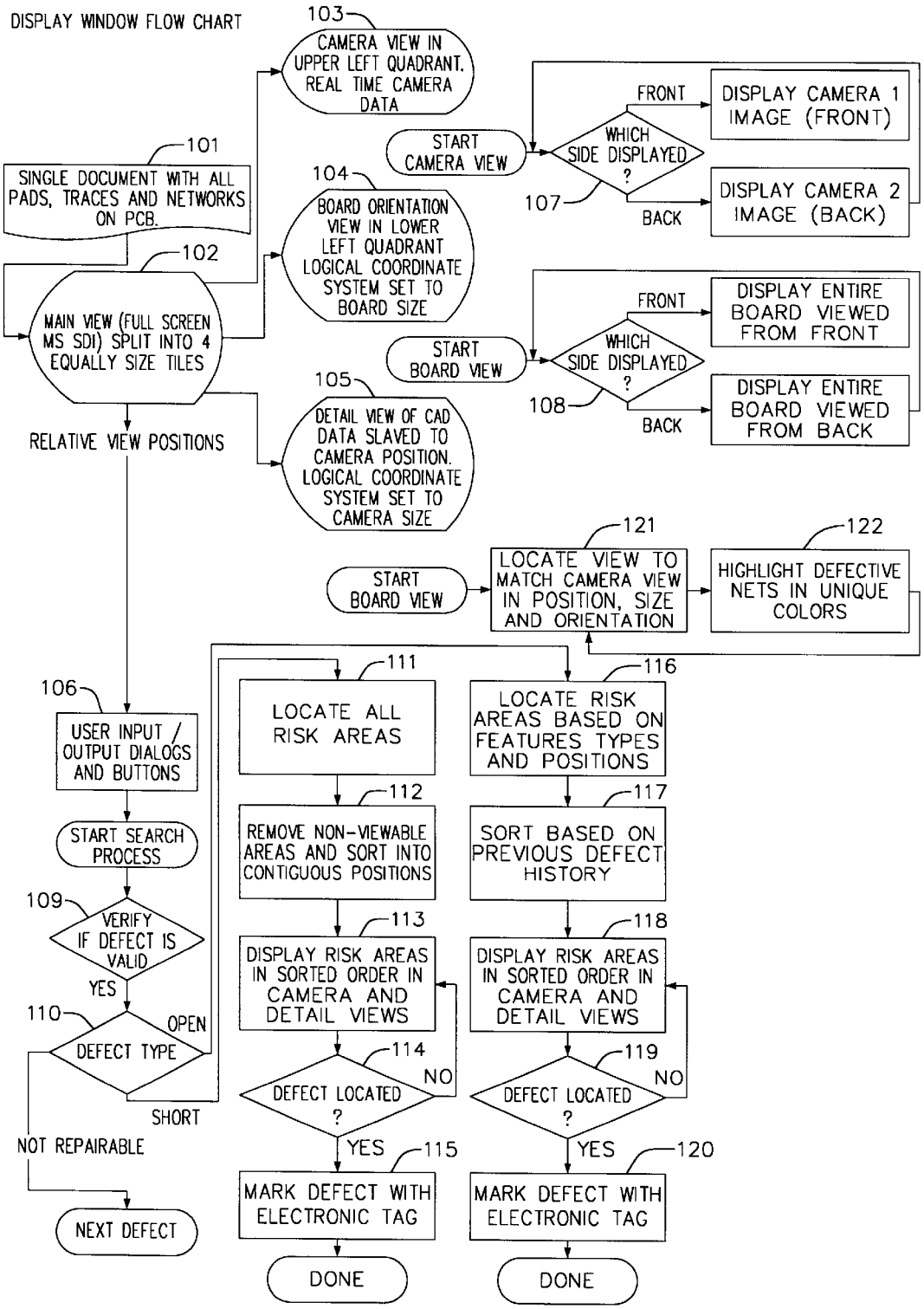
FIG. 3 is a flow chart diagram for the display window of flying prober of FIG. 1.
Figure 4:
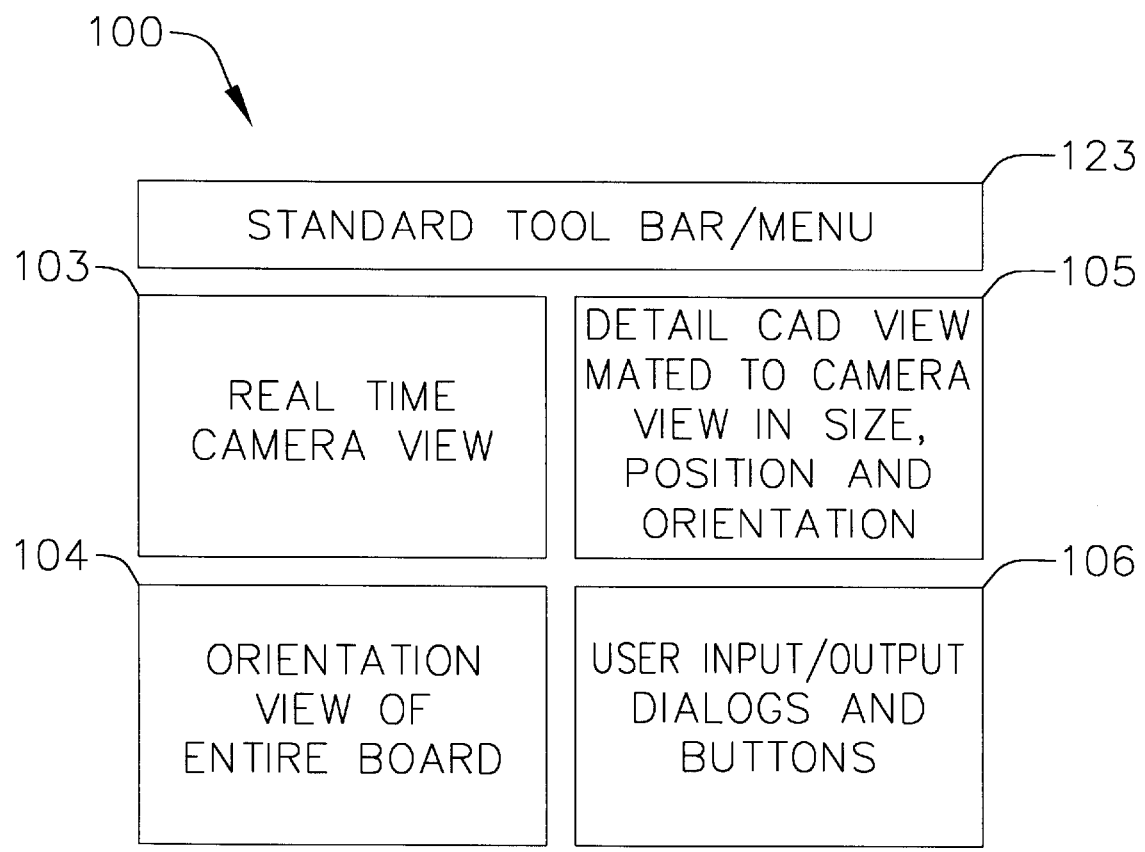
FIG. 4 is a schematic illustration of the screen display of the flying prober of FIG. 1.

As shown in FIGS. 3 and 4, the flying prober 10 includes a novel screen display 100. FIG. 3 illustrates a flow diagram depicting the function of the software used in generating the screen display and performing the fault verification process. All views of the unit under test are created with standard Microsoft CView and CDialog Classes. Standard Microsoft Foundation Class (MFC) document/view architecture is used to store data and generate graphical views of the data 101. A single Document Interface (MFC SDI) is used to attach the graphic views to the document data 102. The screen display 100 is split into four equal sized views. The first view 103, is the upper left view port labeled as Camera View, is updated in real time by video card/camera combination that allows the camera image to be directly transferred to a video RAM via supply dynamical link library. The second view 104 is a board orientation view port located in the lower left quadrant of the display screen 100. The view is based on MFC CView Class with logical coordinate systems set to maintain view of entire board with visual indicators as to current location, side and networks being diagnosed. The third view 105 is a detailed CAD view of the board in the upper right quadrant of the screen. This view is based on MFC CView Class with logical coordinates set to match the camera field of view size and orientation to allow the user to directly compare what artifacts should be on the board (detail view) and the artifacts that are on the board (camera view). The fourth view 106 is user input/output dialogs. These dynamic dialogs are all based on MDF CDialog Class and have in common buttons with universal graphics and text that change based upon the type of defect being verified and/or located on the board.

The camera side 107 is continuously monitored and the camera channel is changed from the front side camera to the back side as needed based upon the side of the unit under test being inspected. The camera side 108 is continuously monitored and the graphic layer displayed is changed as well as the orientation from the component (front) side to the circuit (back) side as needed based on the side being inspected. The defect is verified 109 as being real or false by placing the probe on both of the failed test pads and measuring the resistance.

The resistance is measured by a digital mult-imeter, preferably a Keithley Instruments Model 2400 Source Meter. If the defect is verified as valid, the defect type 110 is established. If the defect is real and not repairable, the board is scrapped. If the defect is real and repairable, then either the open search or the shorts search is implemented based on the defect type. If the defect is false, the board is returned to test.

If the defect is a short, risk zones 111 which are areas of likely defects are calculated based upon the proximity of the networks. Areas that cannot be viewed such as internally to the unit under test are removed 112. Areas are sorted 113 so that the most likely areas and the areas with a history of previous defects are displayed first with the least likely areas displayed last. Zones are displayed 114 with camera and detail views showing each area and allowing the user to determine when the camera (board) does not match the CAD (design) data in such a manner as to cause the short. When the defect is located, it is marked 115 with an electronic arrow and a picture of the defect from the camera view with the electronic arrow is saved in a graphic file for recall later.

When the defect type is an open, risk zones or areas of likely defects are calculated based on network traces 116. Areas that cannot be viewed because they are internal to the board are removed 117. Areas are sorted 118 so that the most likely areas and the areas with a history of previous defects are displayed first, least likely areas last. Zones are displayed 119 with camera and detailed views showing each area and allowing the user to determine when the camera (board) does not match the CAD (design) data in such a manner as to cause the open. When the defect is located, it is marked 120 with an electronic arrow and a picture of the defect from the camera view with the arrow is saved in a graphic file for recall later. Detailed CAD views and camera views are always matched in position, size and orientation 121 so the user can see the differences between the board and the CAD view, thus locating the defects. The networks associated with the defects are always highlighted 122 in unique colors to help the user focus on the nets involved rather than other artifacts not connected with the defects. The display window also includes a standard tool bar menu 123 positioned across the top of the display window 100.

The camera view is registered with Windows O/S and is updated continually via IMSCan 32.DLL. The board view is displayed with a logical coordinate system set such that the board fills the orientation view window. The detailed CAD view is slaved to the camera view such that the size, orientation and positions match. The user input/outputs are based on Microsoft CDialog Class with contents based on contextual requirements.

The screen display of the present invention can also accommodate multiple levels of detailed zoom camera views. For instance, the screen display can include multiple levels of zoom simultaneously to minimize manual graphic manipulations. In such an instance, the screen display would, for example, include in the lower left hand quadrant a graphical representation of the circuit on the unit under test. In the upper left hand quadrant a mid-level zoom camera view of the circuit board would appear. In the upper right hand quadrant a further detailed zoom of the circuit on the unit under test would appear. In the lower right hand quadrant the user input/output dialogs would be present.

Although the present invention has been illustrated with respect to a preferred embodiment thereof, it is to be understood that it is not to be so limited since changes and modification can be made therein, which are intended to be covered within the scope of the invention as hereinafter claimed. For example, although the screen display has been illustrated with respect to a flying prober, the display could be utilized with other types of circuit board test equipment.

What is claimed is:

1. A flying prober comprising:
   at least one prober head for movement across a surface of a unit under test to contact test sites on a unit under test;
   means for measuring isolations and continuities of test sites electrically connected to the test head;
   a loading and locating mechanism for securing the unit under test on the prober relative to the prober head;
   a test probe connected to the test head for contacting the test sites;
   a video camera connected to the test head and positioned to view the contact between the test probe and the test sites; and
   a display screen containing at least a real time camera view of at least a portion of the unit under test and a computer generated software representation view of a reference for the unit under test for comparison, wherein the reference is a view of a nondefective unit under test.

2. The flying prober of claim 1, wherein the display screen has four views.

3. The flying prober of claim 2, wherein the display screen further includes a unit under test orientation view.

4. The flying prober of claim 2, wherein the display screen further includes a user input/output dialogs.

5. The flying prober of claim 2, wherein the display screen includes at least two levels of zoom views of the unit under test.

6. A flying prober comprising:
   at least one prober head;
   at least one test probe positioned in the prober head to contact test sites on a circuit board;
   means for accepting error data for the circuit board;
   means for measuring isolation and continuities of test sites electrically connected to the prober head;
   a camera positioned on the prober head to view the test sites of the circuit board;
   means for generating risk data;
   means for driving the prober head based upon the risk data to scan the risk areas and locate an error on the circuit board; and
   a display window containing at least a real time camera view of at least a portion of the circuit board and a computer generated software representation view of a reference for the circuit board for comparison, wherein the reference is a view of a nondefective unit under test.

7. The flying prober of claim 6, wherein the display screen has four views.

8. The flying prober of claim 7, wherein the display screen further includes a unit under test orientation view.

9. The flying prober of claim 7, wherein the display screen further includes a user input/output dialogs.

10. The flying prober of claim 7, wherein the display screen includes at least two levels of zoom views of the unit under test.

11. A screen display for a repair station comprising:
    a first window containing a real time camera view of a circuit board contained within the repair station; and
    a computer generated software representation view of a reference for the circuit board corresponding to the real time camera view for comparison, wherein the reference is a view of a nondefective circuit board.

12. The display screen of claim 11, wherein there are four views.

13. The display screen of claim 12 further including a circuit board orientation view.

14. The display screen of claim 12 further including user input/output dialogs.

15. The display screen of claim 12 including at least two levels of zoom views of the circuit board.

* * * * *

UNITED STATES PATENT AND TRADEMARK OFFICE
CERTIFICATE OF CORRECTION

PATENT NO. : 6,329,830 B1
DATED : December 11, 2001
INVENTOR(S) : Doug Tackett and Mark A. Swart It is certified that error appears in the above-identified patent and that said Letters Patent is hereby corrected as shown below:

Column 8,
Line 30, replace "claim 11,." with -- claim 11, --.

Signed and Sealed this

Eighteenth Day of February, 2003

JAMES E. ROGAN
*Director of the United States Patent and Trademark Office*